(12) United States Patent
Hasegawa et al.

(10) Patent No.: US 6,771,130 B2
(45) Date of Patent: Aug. 3, 2004

(54) POWER AMPLIFIER AND RADIO COMMUNICATION APPARATUS USING THE SAME

(75) Inventors: Takao Hasegawa, Tondabayashi (JP); Keiichi Sakuno, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/947,446

(22) Filed: Sep. 7, 2001

(65) Prior Publication Data

US 2002/0033735 A1 Mar. 21, 2002

(30) Foreign Application Priority Data

Sep. 7, 2000 (JP) ........................................ 2000-271441

(51) Int. Cl.[7] .............................................. H03F 3/04
(52) U.S. Cl. ...................................... 330/302; 330/310
(58) Field of Search ................................ 330/133, 149, 330/302, 310, 311

(56) References Cited

U.S. PATENT DOCUMENTS

| | | | | |
|---|---|---|---|---|
| 4,438,410 A | * | 3/1984 | Orne | 330/278 |
| 4,559,503 A | * | 12/1985 | Camand et al. | 330/302 |
| 5,726,606 A | * | 3/1998 | Marland | 330/302 |
| 5,889,434 A | | 3/1999 | Shimura et al. | |
| 5,942,946 A | * | 8/1999 | Su et al. | 330/310 |
| 6,329,879 B1 | * | 12/2001 | Maruyama et al. | 330/289 |

FOREIGN PATENT DOCUMENTS

| | | |
|---|---|---|
| JP | 9-260964 A | 10/1997 |
| JP | 10135750 | 5/1998 |
| JP | 10-209763 A | 8/1998 |

* cited by examiner

*Primary Examiner*—Henry Choe
(74) *Attorney, Agent, or Firm*—Birch, Stewart, Kolasch & Birch, LLP

(57) ABSTRACT

A power amplifier has a front and a rear stage. In the rear stage, to a base of a signal-amplifying bipolar transistor is connected one end of a variable impedance element whose impedance changes according to an input power level. An adjusting circuit is connected between the other end of the variable impedance element and a ground. A DC current adjusting element is connected between the other end of the variable impedance element and a supply voltage terminal. The front stage is made to perform class A operation or class AB operation near class A operation, while the rear stage is made to perform class B operation or class AB operation near class B operation. The distortion characteristic of the rear stage is adjusted by the variable impedance element, the adjusting circuit, and the DC current adjusting element so as to offset the distortion characteristic of the front stage.

16 Claims, 13 Drawing Sheets

POWER AMPLIFIER AND RADIO COMMUNICATION APPARATUS USING THE SAME

BACKGROUND OF THE INVENTION

The present invention relates to a power amplifier which is used, for example, in a transmission circuit of a radio communication apparatus and is required particularly to perform a low-distortion amplification, and also relates to a radio communication apparatus using the power amplifier.

In recent years, radio communication systems using a microwave band or a submicrowave band, including mobile communication systems such as a mobile phone, have rapidly come into wide use. This is greatly attributed to the reduction in weight and power consumption of the portable terminals. To make the portable terminal lightweight, it is effective to reduce the weight and capacity of a battery. But the battery having a small capacity is exhausted in a short time. Thus there has been strong demand for the reduction of electric power consumed by a signal transmission power amplifier in the portable terminal, because the power amplifier consumes most of the electric power of the portable terminal. That is, improvement of electric power efficiency has been strongly demanded for. In the recent digital modulation and demodulation using QPSK (Quadrature Phase Shift Keying) modulation technique, the power amplifier is required to amplify an inputted signal linearly because information is represented by amplitude and phase of the signal.

Generally, in the power amplifier, as an output electric power becomes closer to saturation owing to increase of an inputted electric power, distortion and power efficiency become increasingly high. Thus a high power efficiency and a low distortion are in a reciprocal relationship.

A power amplifier developed to realize a low distortion operation is disclosed in Japanese Patent Application Laid-Open No.10-135750

FIG. 13 is a circuit diagram showing the construction of the power amplifier. The power amplifier includes a front-stage signal-amplifying bipolar transistor 101; a rear-stage signal-amplifying bipolar transistor 102, an input terminal 103, an output terminal 104, an input matching circuit 105, a interstage matching circuit 106, an output matching circuit 107, a supply voltage terminal 108, a supply voltage terminal 109 for the base of the front-stage signal-amplifying bipolar transistor 101, and a supply voltage terminal 110 for the base of the rear-stage signal-amplifying bipolar transistor 102.

The operation of the power amplifier having the construction will be described below.

In the power amplifier, the low distortion operation and the high efficiency operation are in the reciprocal relationship, as descried above. To realize both the low distortion operation and the high efficiency operation, a front-stage base-biasing point is set to class A or class AB close to class A, and a rear-stage base-biasing point is set to class B or class AB close to class B.

The operation of the power amplifier will be described below from the viewpoint of a gain distortion of the power amplifier. Because the front stage is set to class A or class AB close to class A, if an input power increases and approaches a saturated power, the gain decreases. On the other hand, because the rear stage is set to class B or class AB close to class B, if the level of the input power increases, the gain also increases. As described above, the amplitude distortion characteristic at the front amplification stage is reverse to that at the rear amplification stage. By controlling the front- and rear-stage amplitude distortion characteristics appropriately, it is possible to adjust the distortion characteristic of the entire power amplifier while not affecting the power efficiency. The distortion characteristic of each of the front and rear stages of the power amplifier can be finely adjusted by changing the base-biasing point of each stage. In particular, because the rear stage is set to class B or class AB close to class B, there is a large change in the distortion characteristic with respect to the change of the base-biasing point. Accordingly, the distortion characteristic of the entire power amplifier is adjusted by utilizing the rear stage mainly.

However, the power amplifier has a problem that because the distortion characteristic is adjusted by changing the base-biasing point, the gain changes simultaneously with the adjustment of the distortion.

SUMMARY OF THE INVENTION

Therefore, it is an object of the present invention to provide a high-efficiency and low-distortion power amplifier capable of accomplishing a distortion adjustment with a simple construction, without changing the gain, and also to provide a radio communication apparatus using the power amplifier.

In order to accomplish the above object, a power amplifier according to an aspect of the present invention includes:

a plurality of amplification stages in each of which a transistor is used as an amplification element; and a distortion compensation circuit for compensating a distortion in at least one of the plurality of amplification stages, wherein the amplification stage that undergoes distortion compensation by the distortion compensation circuit and the remaining amplification stage or stages that dos not undergo the distortion compensation by the distortion compensation circuit have opposite dependencies of an amplitude and/or a phase on an input power level.

In the power amplifier having the construction, the base-biasing point may be set to, for example, class A or class AB close to class A in the amplification stage that does not undergo the distortion compensation by the distortion compensation circuit, whereas the base-biasing point may be set to, for example, class B or class AB close to class B in the at least one amplification stage that undergoes the distortion compensation by the distortion compensation. The distortion characteristic of the power amplifier will be described below from the viewpoint of the amplitude distortion. The amplification stage not having the distortion compensation circuit has a characteristic that as the input power level increases toward a saturated power, a gain decreases, since its operation is set to class A or class AB close to class A. On the other hand, the amplification stage having the distortion compensation circuit has a characteristic that as the input power level increases toward the a saturated power, the gain increases, since its operation is set to class B or class AB close to class B. That is, the amplification stage having the distortion compensation circuit and the amplification stage not having the distortion compensation circuit have opposite dependencies of the amplitude on the input power level. Accordingly, by optimally adjusting the amplitude distortion characteristic of the amplification stage having the distortion compensation circuit, it is possible to offset the amplitude distortion of the amplification stage not having the distortion compensation circuit. If the amplification stage having the distortion compensation circuit and the amplification stage not having the distortion compensation circuit have opposite dependencies of the phase on the input power level, it is possible to adjust the phase distortion characteristic of the amplification stage having the distortion compensation circuit in such a way as to offset the phase distortion of the amplification stage not having the distortion compensation circuit. The transistor in each amplification stage may be a bipolar transistor or a field effect transistor.

There is also provided a power amplifier, according to another aspect of the present invention, which includes:
a plurality of amplification stages in each of which a bipolar transistor is used as an amplification element; and
a distortion compensation circuit for compensating a distortion in at least one of the plurality of amplification stages,
the distortion compensation circuit functioning also as a biasing circuit for the bipolar transistor in the amplification stage that undergoes distortion compensation by the distortion compensation circuit.

In the power amplifier having the above construction, by compensating at least one of the amplitude or the phase in the at least one amplification stage by the distortion compensation circuit, the distortion characteristic of the entire power amplifier is compensated. For example, one or more amplification stages (or all amplification stages) may be provided with the distortion compensation circuit so that each distortion compensation circuit compensates the distortion characteristic of the entire power amplifier. Further, because the distortion compensation circuit serves also as a biasing circuit for the bipolar transistor of the amplification stage that undergoes the distortion compensation, it is unnecessary to additionally provide such a biasing circuit, and the insertion of the distortion compensation circuit does not cause the deterioration of the characteristic of the power amplifier and the increase of the chip area.

A power amplifier according to still another aspect of the present invention includes:
a plurality of amplification stages in each of which a bipolar transistor is used as an amplification element;
a voltage application means for applying a voltage to a base of each of the bipolar transistors in the amplification stages; and
a distortion compensation circuit for compensating a distortion in at least one of the amplification stages,
the distortion compensation circuit including a variable impedance element connected between the voltage application means and the base of the bipolar transistor in the amplification stage that undergoes distortion compensation by the distortion compensation circuit.

In the power amplifier having the construction, the variable impedance element whose impedance or DC resistance component changes with the increase of the level of the input power is used for the distortion compensation circuit to change the transmission characteristic of the distortion compensation circuit owing to the change in the impedance of the variable impedance element and change the operation class with the increase of the level of the input power. Consequently, according to the level of the input power, it is possible to give an influence on the distortion characteristic (amplitude distortion, phase distortion) of the amplification stage having the distortion compensation circuit. For example, when the distortion characteristic is considered in terms of the distortion of the gain, it is possible to increase or decrease the amount of change of the gain without changing the operation class where there is no signal. Accordingly, it is possible to optimally adjust the distortion characteristic of the amplification stage having the distortion compensation circuit, without deteriorating the gain, in such a way as to offset the distortion of the amplification stage not having the distortion compensation circuit.

In one embodiment, the distortion compensation circuit includes an adjusting circuit for adjusting a reactance component and/or a resistance component of an impedance characteristic when the variable impedance element is viewed from the bipolar transistor of the amplification stage that undergoes distortion compensation by the distortion compensation circuit.

In this embodiment, the transmission characteristic of the distortion compensation circuit is adjustable by the adjusting circuit connected to the variable impedance element.

In one embodiment, the distortion compensation circuit includes a DC current adjusting element for adjusting a bias current flowing through a base of the bipolar transistor of the amplification stage that undergoes distortion compensation by the distortion compensation circuit.

In this embodiment, the DC current adjusting element is capable of adjusting the change of the operation class of the amplification stage that undergoes the distortion compensation performed by the distortion compensation circuit.

In one embodiment, the adjusting circuit includes a first resistor element having one end connected to a node between the DC current adjusting element and the variable impedance element, and a capacitor connected between the other end of the first resistor element and a ground. Also, the DC current adjusting element includes a second resistor element whose one end is connected to the voltage application means and whose other end is connected to the variable impedance element.

In the embodiment, the value of the impedance or the DC resistance component of the variable impedance element can be easily changed by adjusting the resistance value of the first resistor element and the capacitance value of the capacitor element. Also, the operation class of the amplification stage whose distortion characteristic is corrected by the distortion compensation circuit is easily changed by adjusting the resistance value of the second resistor element.

In one embodiment, the variable impedance element consists of a diode whose anode is connected to the DC current adjusting element and whose cathode is connected to a base of the bipolar transistor in the amplification stage that undergoes the distortion compensation.

In the embodiment, if the diode constituting the variable impedance element is biased in a forward direction, the equivalent resistance value of the diode decreases with the increase of electric current flowing through the diode. On the other hand, as the level of the input power increases, electric current flowing through the base of the bipolar transistor of the amplification stage undergoing the distortion compensation also increases. Accordingly, the higher the level of the input power, the smaller the equivalent resistance value of the diode. Thus, it is possible to change the operation class of the amplification stage that undergoes the distortion compensation with the increase of the level of the input power.

In one embodiment, the variable impedance element is constituted of a bipolar transistor whose emitter is connected to a base of the bipolar transistor in the amplification stage that undergoes the distortion compensation, and whose base is connected to the DC current adjusting element. Thus, the characteristic of dependence upon the output power of the voltage across the variable impedance element is the same as that of the base-emitter voltage of the bipolar transistor in the amplification stage. Thus the arrangement of this embodiment is effective for achieving the distortion compensation for a wide range of input power levels.

In one embodiment, the variable impedance element is constituted of a variable impedance bipolar transistor whose emitter is connected to a base of the bipolar transistor in the amplification stage that undergoes the distortion compensation, and whose base is connected to the DC current adjusting element. The adjusting circuit is constituted of a first resistor element connected between a collector and a base of the variable impedance bipolar transistor and a capacitor element connected between the base of the variable impedance bipolar transistor and a ground. And, the DC current adjusting element is constituted of a second resistor element whose one end is connected to the voltage application means and whose other end is connected to the variable impedance element.

In the power amplifier of the embodiment, a voltage is also applied across the collector and the emitter of the variable impedance bipolar transistor serving as the variable impedance element. Because that voltage is adjustable by the first resistor element, it is possible to adjust the characteristic of the variable impedance element.

In one embodiment, the variable impedance element is constituted of a variable impedance bipolar transistor whose emitter is connected to a base of the bipolar transistor in the amplification stage that undergoes the distortion compensation, and whose base is connected to the DC current adjusting element. The adjusting circuit is constituted of a first resistor element having one end connected to a node between the DC current adjusting element and the variable impedance element, and a capacitor connected between the other end of the first resistor element and a ground. Also, the DC current adjusting element is constituted of a second resistor element whose one end is connected to the voltage application means and whose other end is connected to the variable impedance element, and a third resistor element connected between the base of the bipolar transistor in the amplification stage that undergoes the distortion compensation and a ground.

In the embodiment, the base-biasing point of the bipolar transistor in the amplification stage that undergoes the distortion compensation is determined by the ratio of the resistance values of the second and third resistor elements. Therefore, it is possible to adjust a base bias voltage by the third resistor element after having optimally adjusted the distortion characteristic by the second resistor element.

There is also provided a radio communication apparatus, according to a further aspect of the present invention, that uses the power amplifier of any type described above in a functional block for supplying a signal to a transmission antenna thereof.

Use of the power amplifier in the radio communication apparatus provides the latter with a characteristic of high efficiency and low distortion when the radio communication apparatus transmits a signal. Thus, it is possible to design the radio communication apparatus so as to be compact.

BRIEF DESCRIPTION OF THE DRAWINGS

The present invention will become more fully understood from the detailed description given hereinbelow and the accompanying drawings which are given by way of illustration only, and thus are not limitative of the present invention, and therein.

DETAILED DESCRIPTION OF THE PREFERRED EMBODIMENTS

First Embodiment

Figure 1:
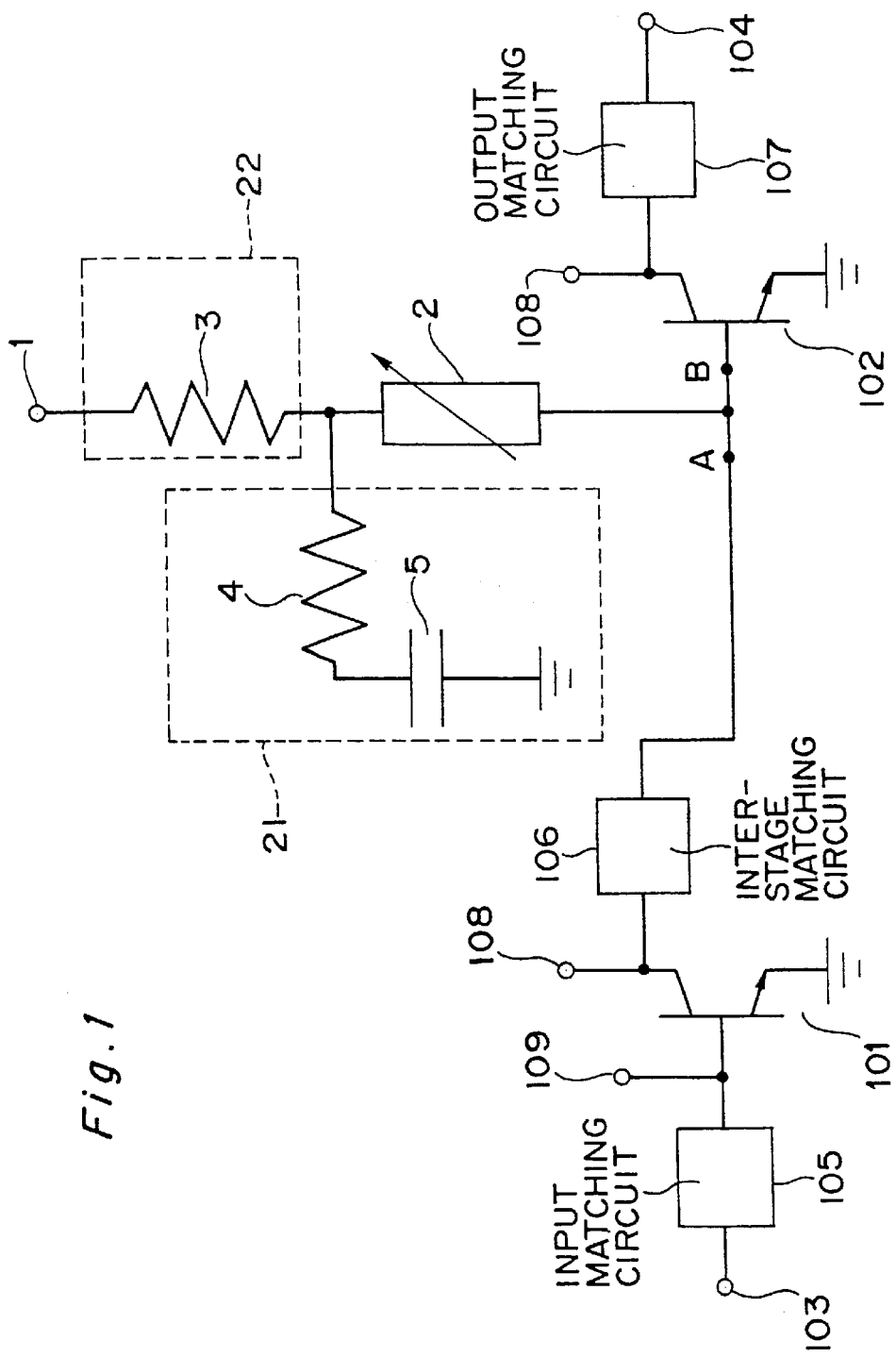
FIG. 1 is a circuit diagram showing the construction of a first embodiment of the power amplifier of the present invention.
Figure 13:
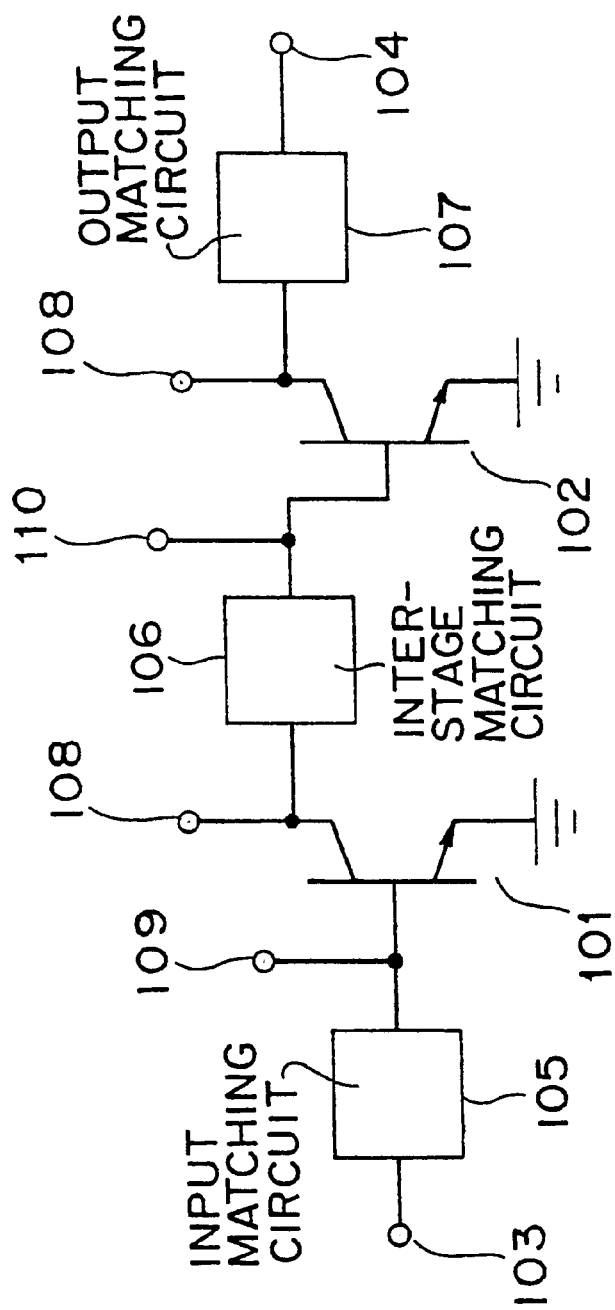
FIG. 13 is a circuit diagram showing the construction of a conventional power amplifier.

FIG. 1 is a circuit diagram showing the construction of a power amplifier of a first embodiment of the present invention. The power amplifier of the first embodiment has a construction same as that of the conventional power amplifier shown in FIG. 13 except a variable impedance element, an adjusting circuit, and a DC current adjusting element. Therefore, like parts are designated by like reference numerals in these figures.

Referring to FIG. 1, the power amplifier has a front-stage signal-amplifying bipolar transistor 101, a rear-stage signal-amplifying bipolar transistor 102, an input terminal 103, an output terminal 104, an input matching circuit 105 connected between the input terminal 103 and a base of the front-stage signal-amplifying bipolar transistor 101, an interstage matching circuit 106 connected between a collector of the front-stage signal-amplifying bipolar transistor 101 and a base of the rear-stage signal-amplifying bipolar transistor 102, an output matching circuit 107 connected between a collector of the rear-stage signal-amplifying bipolar transistor 102 and the output terminal 104, a supply voltage terminal 108 connected to each of the collector of the signal-amplifying bipolar transistors 101 and 102, and a base-biasing supply voltage terminal 109 connected to the base of the front-stage signal-amplifying bipolar transistor 101. In the power amplifier, one end of the variable impedance element 2 is connected to the base of the rear-stage signal-amplifying bipolar transistor 102, while the other end of the variable impedance element 2 is connected to one end of a resistor 4 serving as a first resistor element. A capacitor 5 is connected between the other end of the resistor 4 and the ground. The resistor 4 and the capacitor 5 constitute an adjusting circuit 21. A resistor 3 serving as a second resistor element is connected between the other end of the variable impedance element 2 and a supply voltage terminal 1 serving as a base-biasing voltage application means. The resistor 3 constitutes a DC current adjusting element 22. Also, the variable impedance element 2, the adjusting circuit 21, and the DC current adjusting element 22 constitute a combined distortion compensation circuit and base-biasing circuit.

In the power amplifier having the construction, a front-stage base-biasing point is set to class A or class AB close to class A, whereas a rear-stage base-biasing point is set to class B or class AB close to class B. The distortion characteristic of each of the front and rear amplification stages will be described below from the viewpoint of a gain distortion. The front stage is set to class A or class AB close to class A. Thus when the level of an input power increases and approaches a saturated power level, a gain decrease phenomenon occurs. On the other hand, the rear stage is set to class B or class AB close to class B. Thus when the level of the input power increases, a gain increase phenomenon occurs.

The adjustment of the distortion characteristic of the rear stage will be described below from the viewpoint of the high frequency characteristics.

When the supply voltage terminal 1 has an infinite impedance, the transmission characteristic between points A and B in FIG. 1, $S_{BA}$, (forward transmission characteristic of parameter S) is expressed as follows:

$$S_{BA}=2/\{1/(Zc+Zd)+2\} \quad (1)$$

where Zc is the impedance of the adjusting circuit 21 and Zd is the impedance of the variable impedance element 2.

Supposing that an impedance when the front-stage is viewed from point A is Za, an impedance Zb when the front-stage is viewed from point B, namely, the signal-source impedance of the rear-stage signal-amplifying bipolar transistor 102 is expressed as follows:

$$Zb=1/\{1/Za+1/(Zc+Zd)\} \quad (2)$$

With the change of the level of the input power, the impedance Zd of the variable impedance element 2 changes. Consequently, the transmission characteristic $S_{BA}$ and the impedance Zb change. At this time, even if the variable impedance element 2 is determined so that a nonlinear characteristic of the impedance Zd is fixed, the transmission characteristic $S_{BA}$ and the impedance Zb can be adjusted by a value of the impedance Zc of the adjusting circuit 21.

As described above, the distortion characteristic of the entire power amplifier is controlled optimally by adjusting the distortion characteristic of the rear stage rearward from the point A so as to offset the distortion characteristic of the front stage. At this time, because the transmission characteristic $S_{BA}$ and the impedance Zb are complex numbers, both the amplitude distortion and the phase distortion are effectively controlled.

Next, the adjustment of the distortion characteristic of the rear stage will be described below from the viewpoint of DC characteristics.

A DC resistance component Rd of the variable impedance element 2 changes according to a voltage across the variable impedance element 2. In the case where a diode is used as the variable impedance element 2, the DC resistance component Rd has the characteristic that it decreases with the increase of the voltage across the variable impedance element 2. Supposing that the resistance value of the resistor 3 is Rdc, the voltage at the supply voltage terminal 1 is Vbb, and that the base current flowing through the signal-amplifying bipolar transistor 102 is Ib, the base voltage Vbe of the signal-amplifying bipolar transistor 102 is expressed as follows:

$$Vbe=Vbb-(Rdc+Rd)Ib \quad (3)$$

Because the base is biased such that the class B operation or the class AB operation is performed in the bipolar transistor of the rear stage, the base current Ib increases with the increase of the level of the input power. On the other hand, in the first embodiment, the DC resistance component Rd decreases with the increase of the level of the input power. Supposing that values of variables in equation (3) that change with the input power level, namely, the base voltage Vbe, the DC resistance component Rd, and the base current Ib have changed by ΔVbe, ΔRd, and ΔIb, respectively, the following equation (4) is obtained.

$$\Delta Vbe=-(Rdc+Rd)\Delta Ib-(Ib+\Delta Ib)\Delta Rd \quad (4)$$

As described above, when the level of the input power increases,

ΔIb>0

ΔRd<0

In equation (4) above, because the values of resistance Rdc, the DC resistance component Rd, and the base current Ib are positive numbers, the firm term, −(Rdc+Rd)ΔIb, in the right side assumes a negative value, and the second term, −(Ib+ΔIb)ΔRd, assumes a positive value.

Accordingly, by appropriately selecting values of each variable of the right side of the equation (4), ΔVbe can be a positive number. Thus with the increase of the level of the input power, the increase of the base voltage Vbe, namely, a shift of the class A operation occurs. Thus occurrence of a gain increase phenomenon is facilitated. As a result, when compared with the conventional power amplifier in which its operation class does not shift according to the level of the input power, the power amplifier of the embodiment can obtain an amplitude distortion characteristic equivalent to that of the conventional power amplifier, with the operation class when there is no signal being closer to class A. Therefore, the gain can be increased. Further, even when the variable impedance element 2 is determined so that its nonlinear characteristic ΔRd is fixed, the variable ΔVbe can be controlled by varying the resistance value Rdc of the resistor 3, as seen from the equation (4). As described above, the distortion characteristic of the entire power amplifier can be controlled optimally by adjusting the distortion characteristic of the rear stage rearward from the point A so as to offset or cancel the distortion characteristic of the front stage, without changing operation class when there is no signal.

Again, according to the present embodiment, the distortion characteristic of the entire power amplifier can be controlled optimally by adjusting the distortion characteristic of the rear stage to offset the characteristic of the front stage. Further because the distortion characteristic of the power amplifier can be controlled without changing the operation class when there is no signal. Therefore, the deterioration of the gain can be prevented. Further because the distortion compensation circuit serves also as the biasing circuit, it is unnecessary to provide the power amplifier with a separate biasing circuit, but yet it is possible to prevent the characteristic of the power amplifier from being deteriorated due to the insertion of the distortion compensation circuit thereinto. Thus it is possible to allow the power amplifier to be compact.

Second Embodiment

Figure 2:
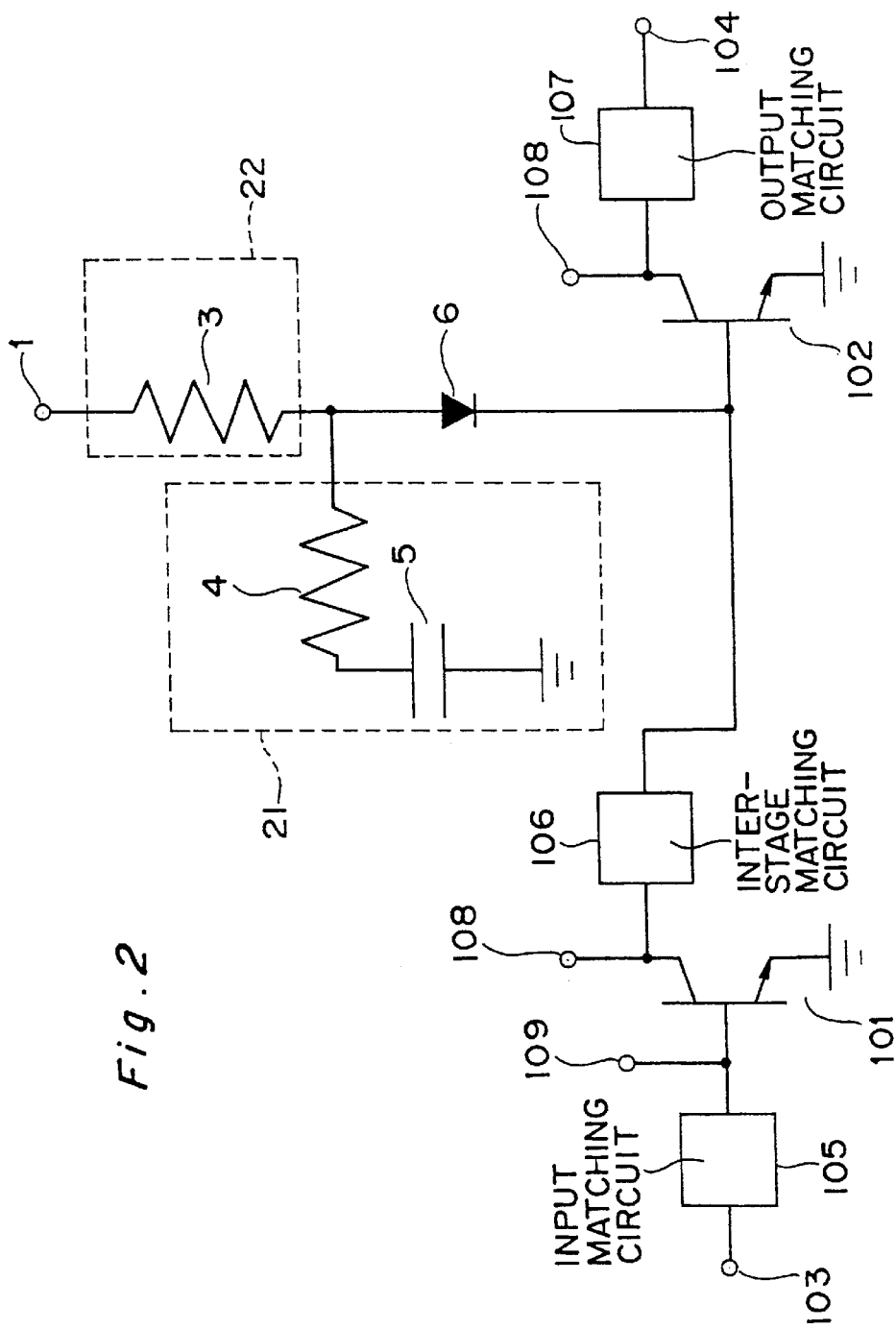
FIG. 2 is a circuit diagram showing the construction of a second embodiment of the power amplifier of the present invention.

FIG. 2 is a circuit diagram showing the construction of a power amplifier according to a second embodiment of the present invention. As shown in FIG. 2, instead of the variable impedance element 2 of the power amplifier shown in FIG. 1, the power amplifier of FIG. 2 uses a variable impedance diode 6 as a variable impedance element. The power amplifier of the second embodiment has the same construction as that of the power amplifier of the first embodiment except the variable impedance element. Therefore, like parts are designated by like reference numerals and description thereof are omitted herein.

In the power amplifier, the variable impedance diode 6 is biased in a forward direction. In this case, as electric current flowing through the variable impedance diode 6 becomes higher, an equivalent resistance value thereof becomes lower. On the other hand, as the level of the input power becomes higher, the base current flowing through the signal-amplifying bipolar transistor 102 also becomes higher. That, as the level of the input power becomes higher, the equivalent resistance value of the variable impedance diode 6 becomes lower. As a result, it is possible to make a base-emitter voltage variation ΔVbe, shown in FIG. 4, of the signal-amplifying bipolar transistor 102 positive.

The second embodiment has an effect similar to that of the first embodiment.

Third Embodiment

Figure 3:
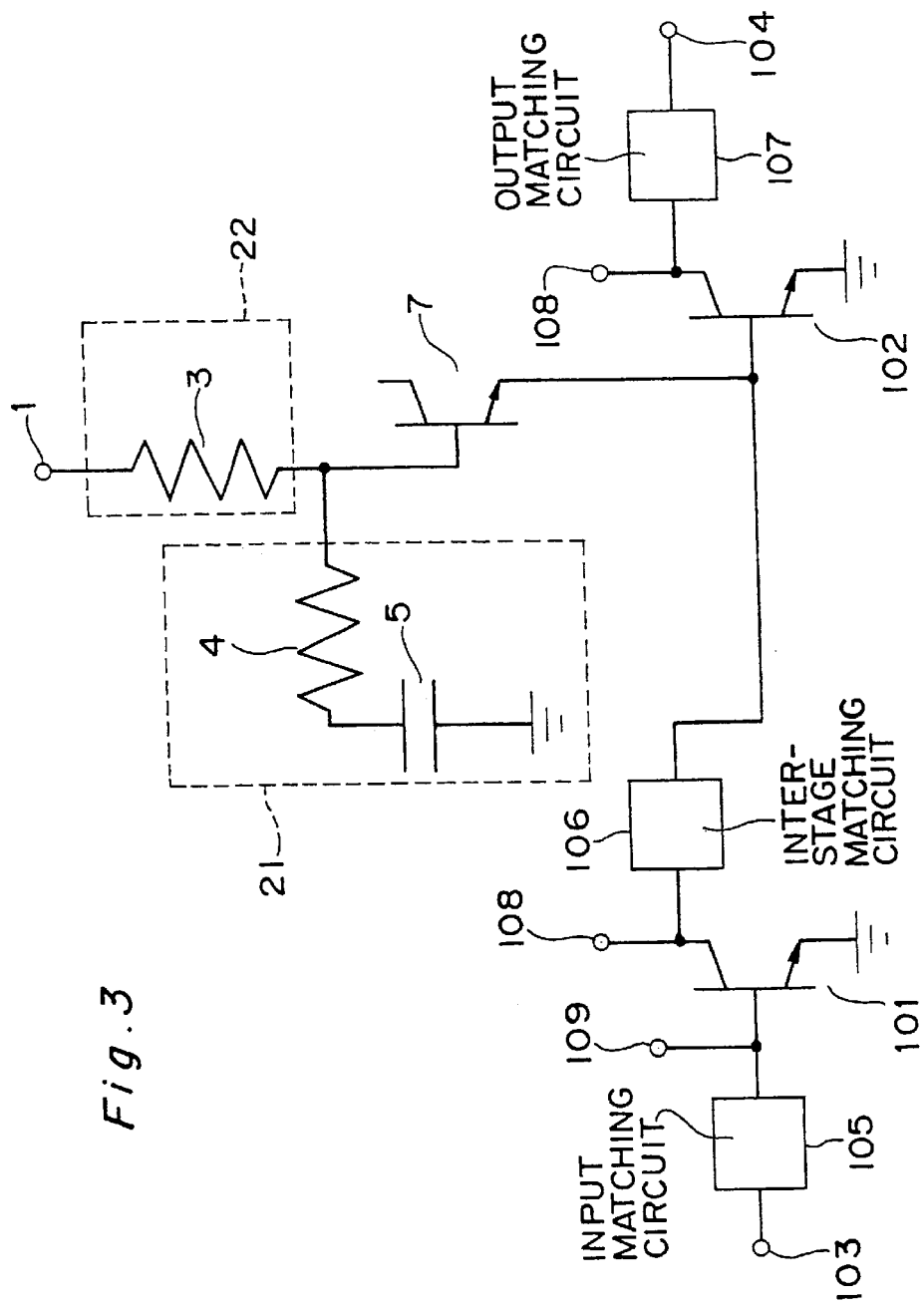
FIG. 3 is a circuit diagram showing the construction of a third embodiment of the power amplifier of the present invention.

FIG. 3 is a circuit diagram showing the construction of a power amplifier according to a third embodiment of the present invention. As shown in FIG. 3, in the power amplifier, the variable impedance element is constituted of a base-emitter diode of a bipolar transistor. The power amplifier of the third embodiment has the same construction as that of the power amplifier of the first embodiment except the variable impedance element. Therefore, like parts are designated by like reference numerals, and description thereof are omitted herein.

As shown in FIG. 3, the collector of the variable impedance bipolar transistor 7 is not used in the third embodiment. Because a bipolar transistor of the same kind as the signal-amplifying bipolar transistor 102 of the amplification stage is used as the variable impedance element in the third embodiment, the characteristic of dependence upon the output power of the voltage across the variable impedance element is the same as that of the base-emitter voltage of the signal-amplifying bipolar transistor. Thus the arrangement of this embodiment is effective for achieving the distortion compensation for a wide range of input power levels.

Figure 4:
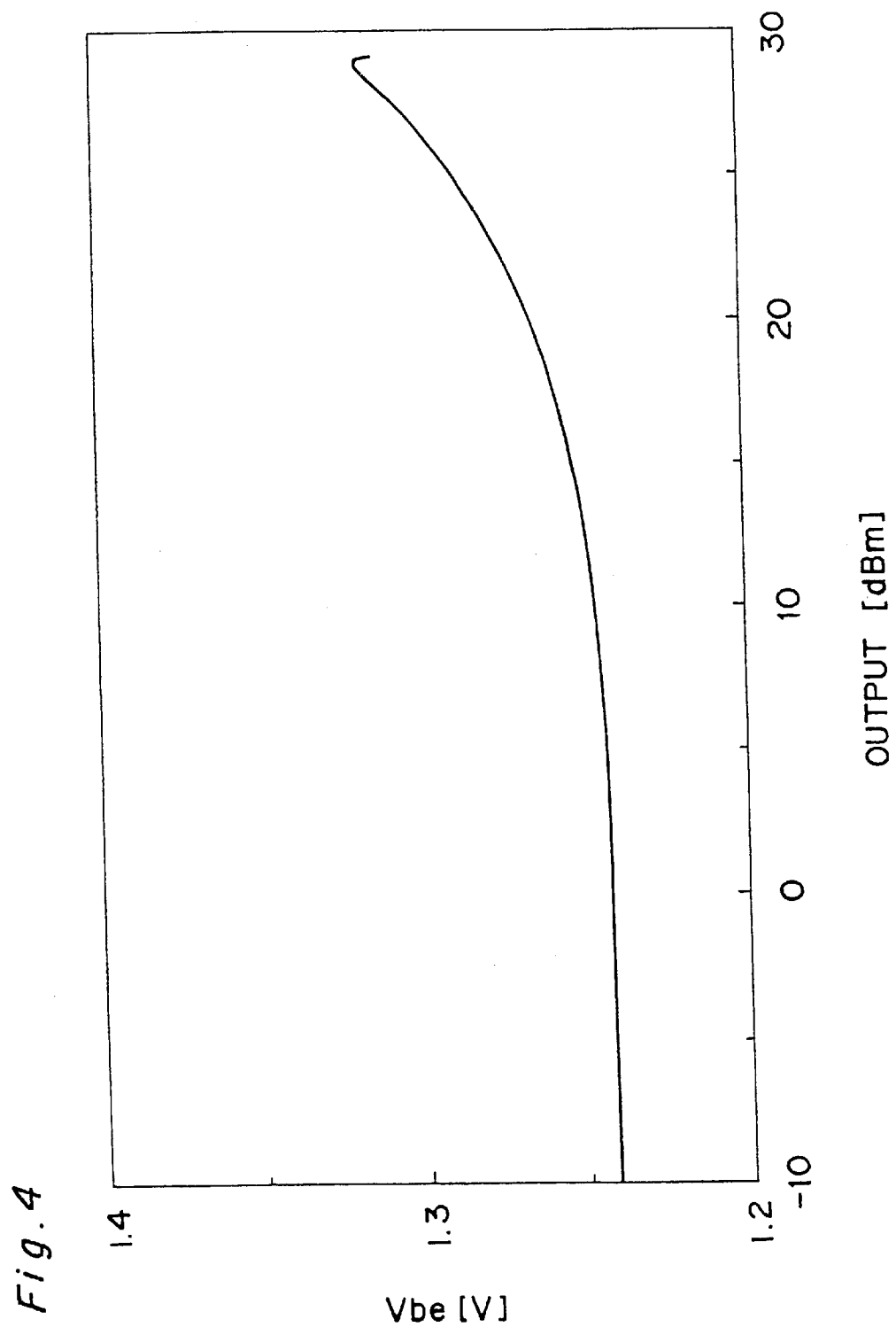
FIG. 4 shows dependency of a voltage across the base and the emitter of a signal-amplifying bipolar transistor of the power amplifier on an output power of the signal-amplifying bipolar transistor.
Figure 5:
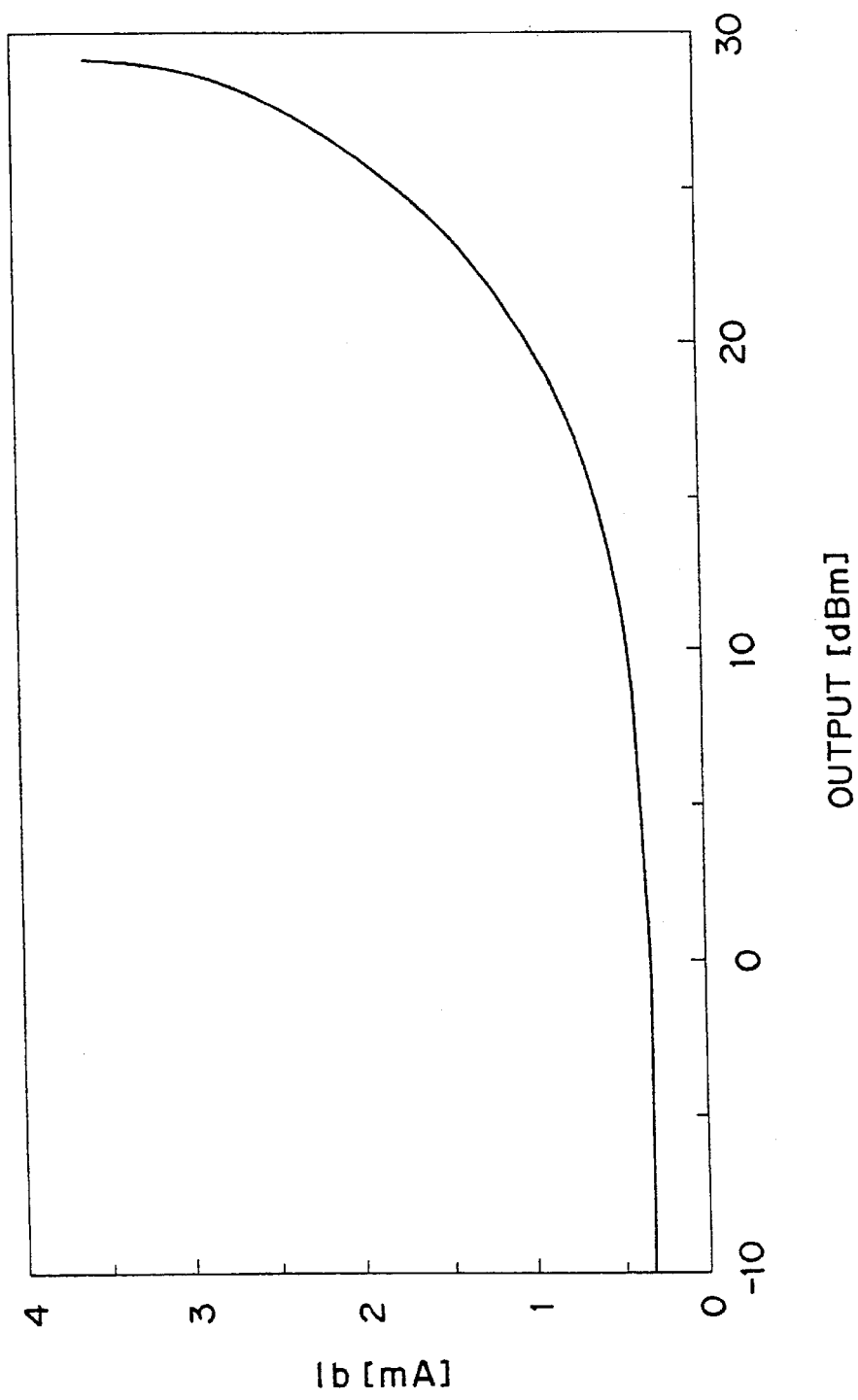
FIG. 5 shows dependency of a base current of the signal-amplifying bipolar transistor on the output power of the signal-amplifying bipolar transistor in the power amplifier.
Figure 6:
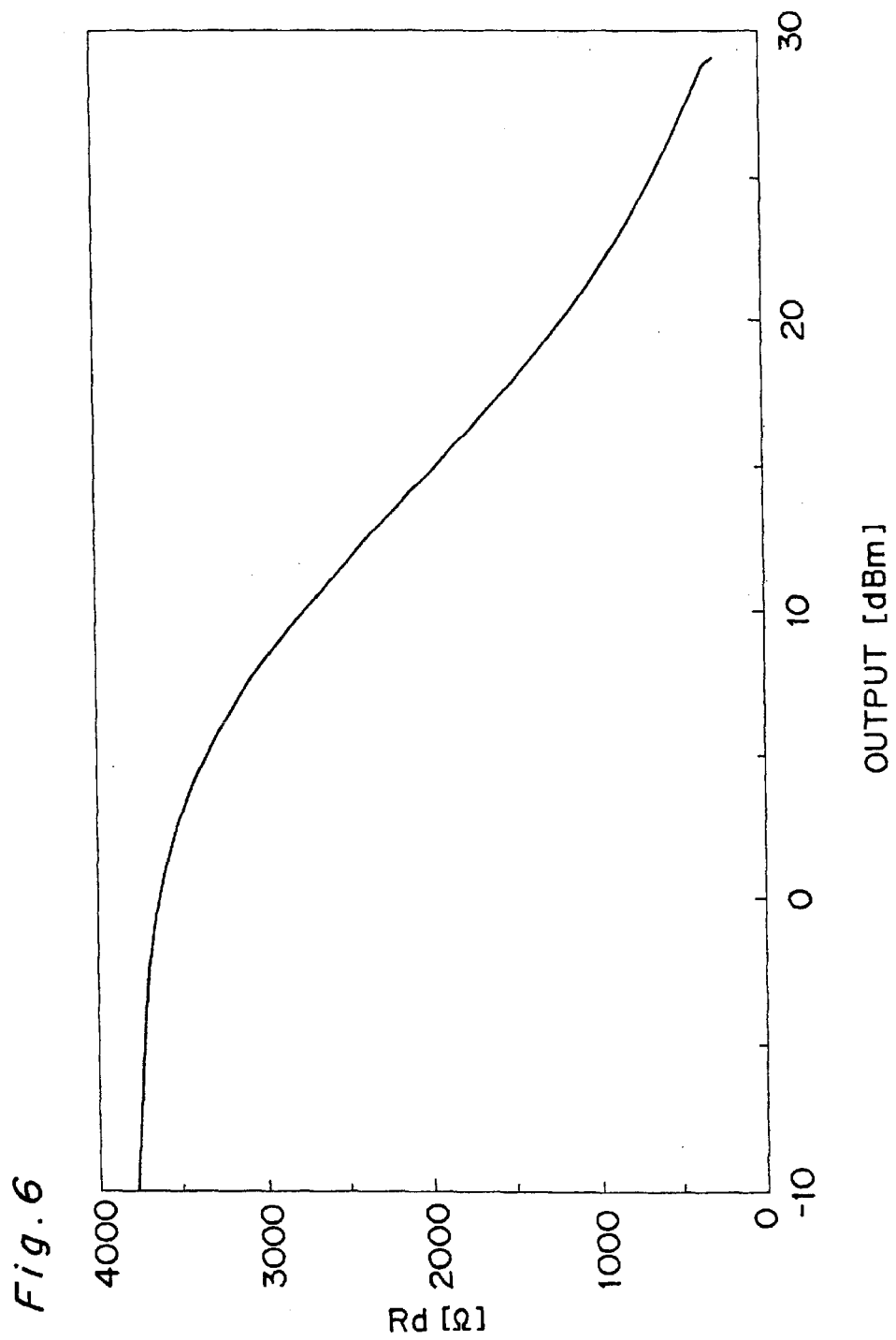
FIG. 6 shows dependency of a DC resistance component in a base emitter diode of a variable-impedance bipolar transistor on the output power of the signal-amplifying bipolar transistor in the power amplifier.

FIG. 4 shows the result of a simulation about the change of the base-emitter voltage Vbe of the signal-amplifying bipolar transistor 102 with respect to the output power. FIG. 5 shows the result of a simulation about the change of the base current Ib of the signal-amplifying bipolar transistor 102 with respect to the output power. FIG. 6 shows the result of a simulation about the change of the DC resistance component Rd of the base-emitter diode (variable impedance bipolar transistor 7) with respect to the output power of the signal-amplifying bipolar transistor 102. For these simulations, a commercially available harmonic balance simulator was used.

In the simulations the results of which are shown in FIGS. 4, 5, and 6, as the bipolar transistors, AlGaAs/GaAs HBTs (Hetero-junction Bipolar Transistors) modeled according to an Ebers-Moll model were used. The area of the emitter of the signal-amplifying bipolar transistor 102 was set to 6.4 μm×80 μm×3. The area of the emitter of the variable impedance bipolar transistor 7 was set to 6.4 μm×40 μm×1. As indicated in FIGS. 5 and 6, with the increase of the output power, the DC resistance component Rd decreases but the base current Ib increases. Therefore, the following conditions for allowing ΔVbe to be positive (ΔVbe>0), as explained in connection with the equation (4), are satisfied:

$$\Delta Ib > 0$$

$$\Delta Rd < 0$$

Actually, as shown in FIG. 4, the base voltage Vbe increased with the increase of the output power.

Figure 7:
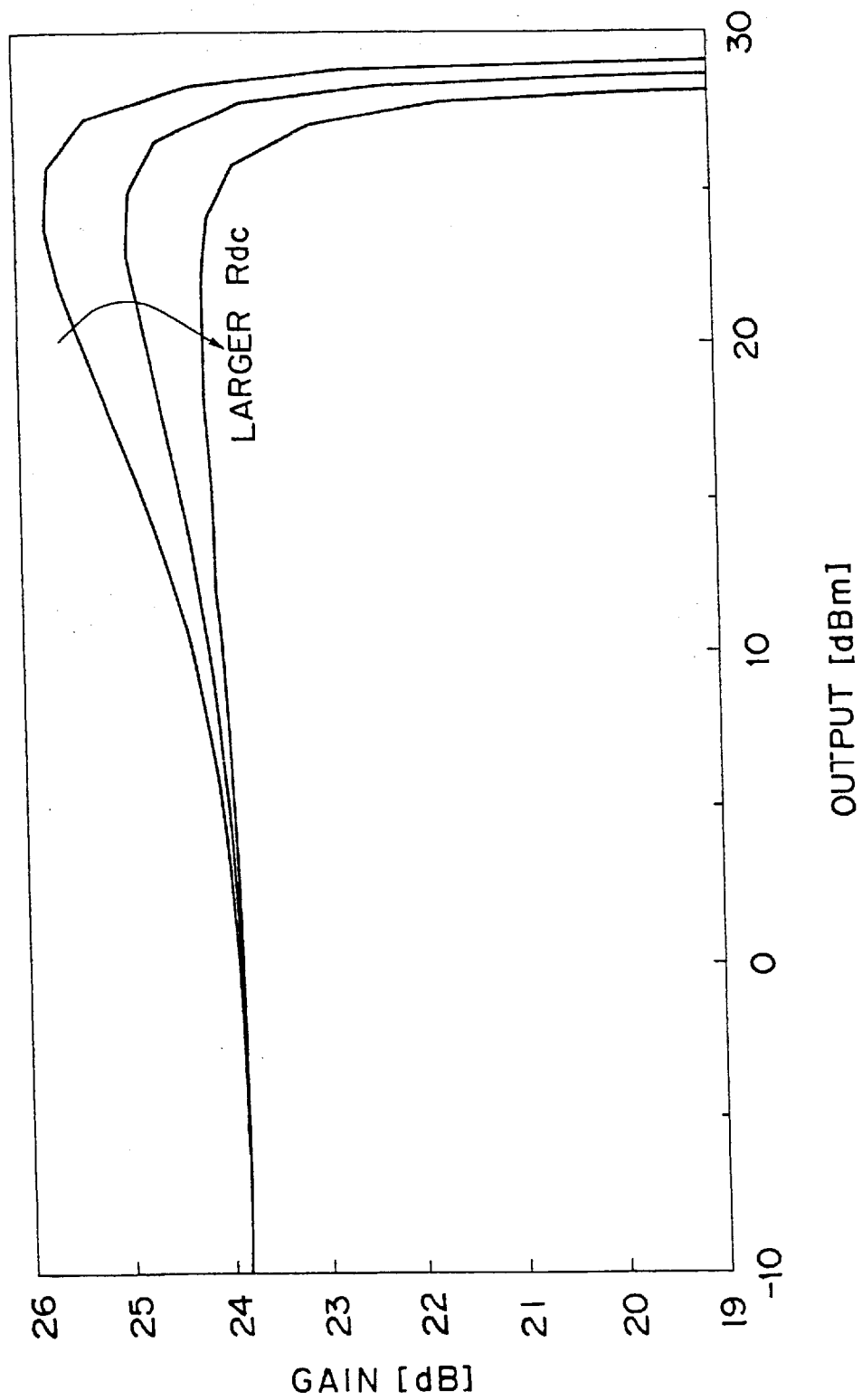
FIG. 7 shows the amplitude distortion characteristic of the power amplifier when a resistance value of a resistor in a DC current adjusting element of the power amplifier is changed.

FIG. 7 shows the result of a simulation about the change in the gain of the entire power amplifier when the resistance value Rdc of the resistor 3 of the DC current adjusting element 22 was changed. In this case, the front-stage signal-amplifying bipolar transistor 101 used was modeled according to an HBT model, and the area of the emitter of the bipolar transistor 101 was set to 6.4 μm×20 μm×4. And, the base voltage was adjusted so that when there was no signal, the collector current was constant irrespective of the change of the resistance value Rdc. FIG. 7 indicates that the amplitude distortion characteristic can be controlled by the resistance value Rdc.

Figure 8:
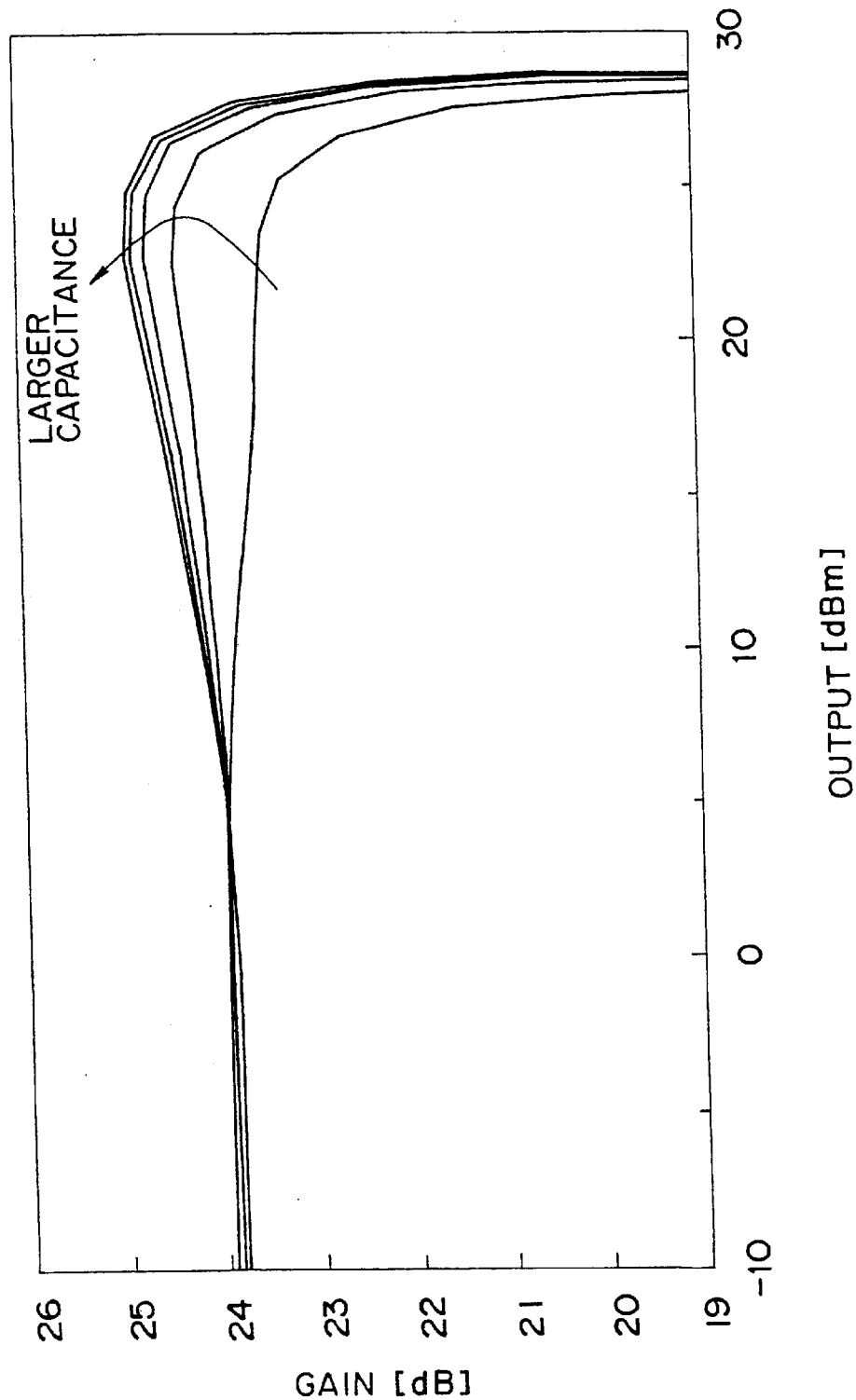
FIG. 8 shows the amplitude distortion characteristic of the power amplifier when a capacitance value of a capacitor in a adjusting circuit of the power amplifier is changed.

FIG. 8 shows the result of a simulation about the change in the gain of the entire power amplifier when the capacitance of the capacitor 5 of the adjusting circuit 21 was changed. The conditions for the simulation were similar to the conditions for the simulation the result of which is shown in FIG. 7. FIG. 8 indicates that the amplitude distortion characteristic could be controlled by the capacitor 5 as well.

As described above, the basic concept of the first embodiment can be realized by means of the specific circuits. In the third embodiment, the base-emitter diode of the variable impedance bipolar transistor 7 is used as the variable impedance element. Alternatively, a base-collector diode of the bipolar transistor with its emitter open may be used.

Fourth Embodiment

Figure 9:
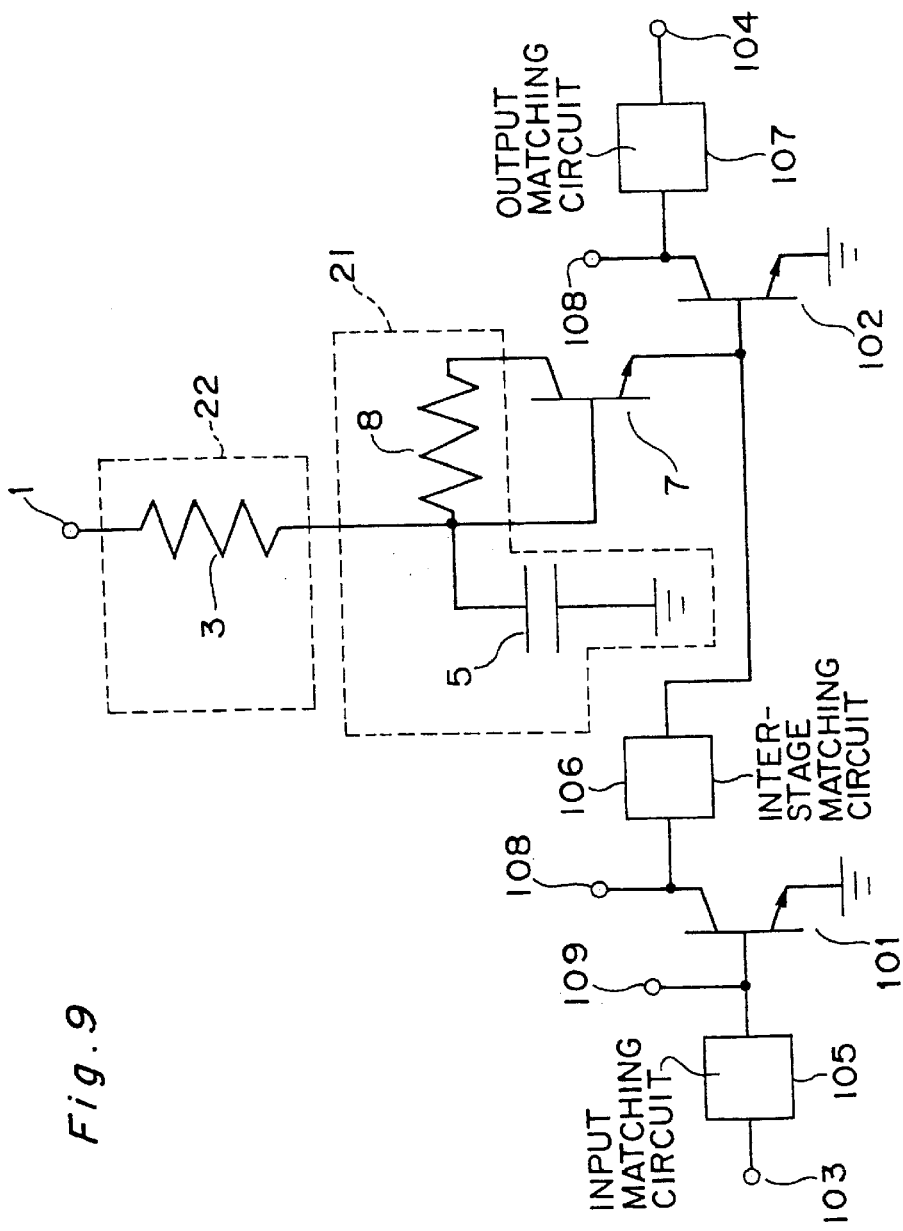
FIG. 9 is a circuit diagram showing the construction of a fourth embodiment of the power amplifier of the present invention.

FIG. 9 is a circuit diagram showing the construction of a power amplifier according to a fourth embodiment of the present invention. The power amplifier of the fourth embodiment has the same construction as that of the power amplifier of the third embodiment except the variable impedance element and the adjusting circuit. Therefore, like parts are designated by like reference numerals and description thereof are omitted herein.

As shown in FIG. 9, in the power amplifier, the emitter of a bipolar transistor 7 as a variable impedance element is connected to the base of the rear-stage signal-amplifying bipolar transistor 102. Further a resistor 8 serving as a first resistor element is connected between the collector and the base of the variable impedance bipolar transistor 7. Further a capacitor 5 is connected between the base and the emitter of the variable impedance bipolar transistor 7 and the ground. The adjusting circuit 25 is constructed of the resistor 8 and the capacitor 5. A resistor 3 serving as a second resistor element is connected between the base of the variable impedance bipolar transistor 7 and the base-biasing supply voltage terminal 1. The resistor 3 constitutes a DC current adjusting element 22. The variable impedance bipolar transistor 7, the adjusting circuit 21, and the DC current adjusting element 22 constitute a combined distortion compensation circuit and base-biasing circuit.

As is obvious, in the power amplifier of the fourth embodiment shown in FIG. 9, instead of the resistor 4 of the power amplifier shown in FIG. 3, the resistor 8 is inserted between the base and the collector of the variable impedance bipolar transistor 7. In this case, a voltage is also applied across the base and the collector of the variable impedance bipolar transistor 7 and that voltage is adjustable by the resistor 8. Therefore, it is possible to adjust the characteristic of the bipolar transistor 7 serving as the variable impedance element.

In the fourth embodiment, a node between the resistor 3 and the capacitor 5 is connected to the base of the variable impedance bipolar transistor 7, but may be connected to the collector of the bipolar transistor 7.

Fifth Embodiment

Figure 10:
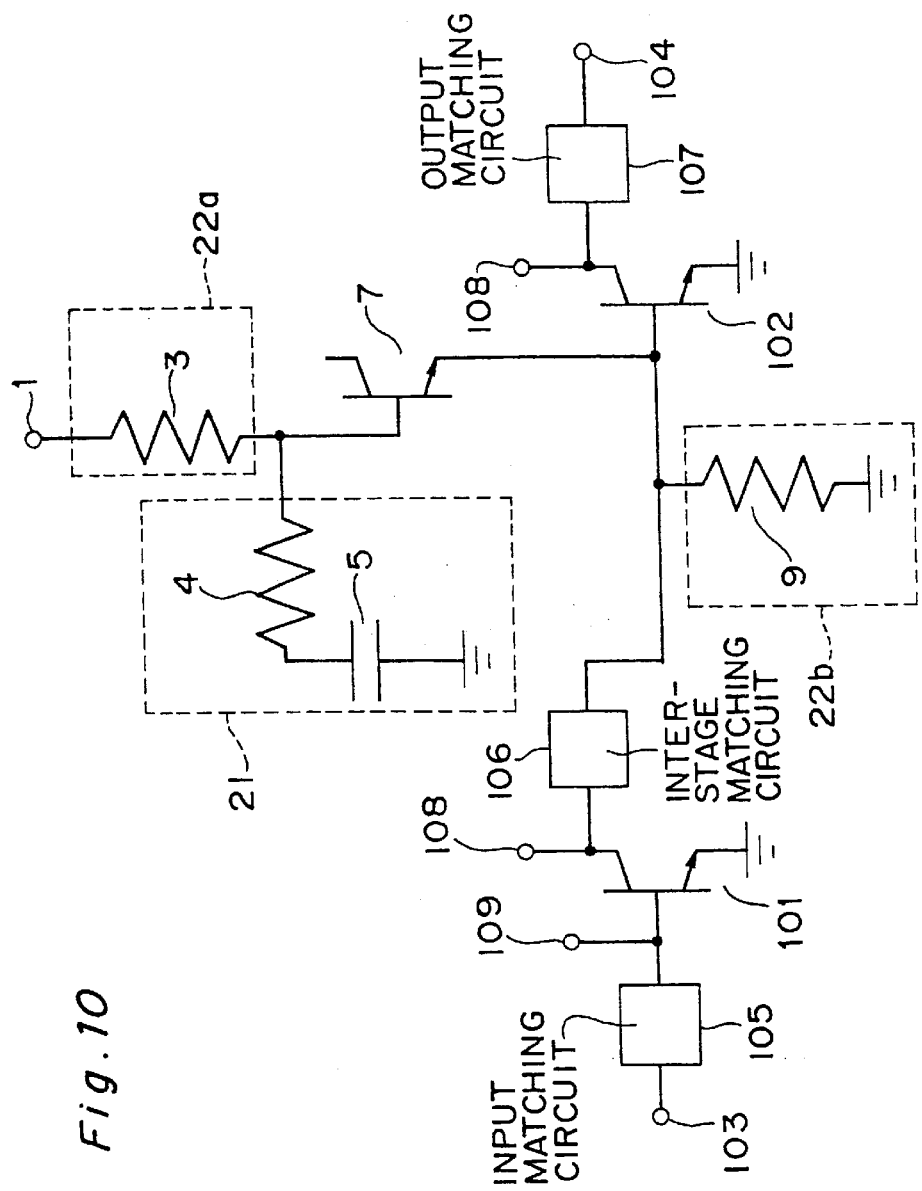
FIG. 10 is a circuit diagram showing the construction of a fifth embodiment of the power amplifier of the present invention.

FIG. 10 is a circuit diagram showing the construction of a power amplifier according to a fifth embodiment of the present invention. The power amplifier of the fifth embodiment has the same construction as that of the power amplifier of the third embodiment except the DC current adjusting element. Therefore, like parts are designated by like reference numerals and description thereof are omitted herein.

As shown in FIG. 10, in addition to the resistor 3 serving as the second resistor element which constitutes a first DC current adjusting element 22a, a resistor 9 serving as a third resistor element which constitutes a second DC current adjusting element 22b is connected between the base of the signal-amplifying bipolar transistor 102 and the ground. In this case, the base-biasing point of the signal-amplifying bipolar transistor 102 is determined by the ratio between a resistance value of the resistor 3 and that of the resistor 9. Therefore, after the distortion characteristic has been properly adjusted by the resistor 3, the base-biasing voltage can be adjusted by the resistor 9.

Sixth Embodiment

Figure 11:
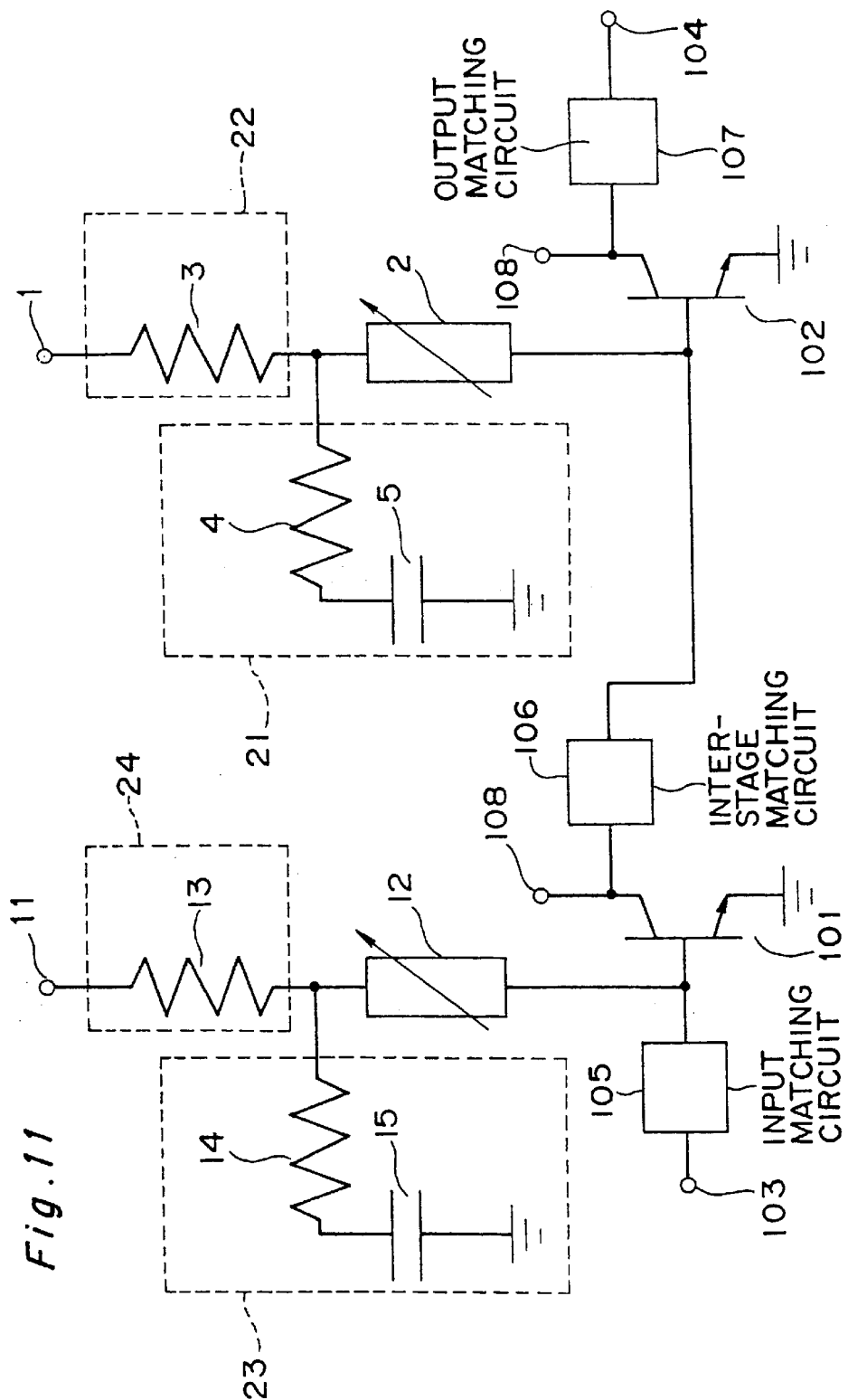
FIG. 11 is a circuit diagram showing the construction of a sixth embodiment of the power amplifier of the present invention.

FIG. 11 is a circuit diagram showing the construction of a power amplifier of a sixth embodiment of the present invention. The power amplifier of the sixth embodiment has the same construction as that of the power amplifier of the first embodiment shown in FIG. 1 except that the front-stage in the sixth embodiment further has a variable impedance element, an adjusting circuit and a DC current adjusting element. Therefore, like parts are designated by like reference numerals and description thereof are omitted herein.

With reference to FIG. 11, the power amplifier includes a supply voltage terminal 11 for biasing the base of the front-stage signal-amplifying bipolar transistor 101, a variable impedance element 12 whose characteristic changes according to a level of an input power, an adjusting circuit 23 constructed of a series arrangement of a resistor 14 and a capacitor 15, and a DC current adjusting element 24 constructed of a resistance 13. The variable impedance element 12, the adjusting circuit 23, and the DC current adjusting element 24 constitute a combined distortion compensation circuit and base-biasing circuit.

As indicated in the equation (4), the variation $\Delta Vbe$ of the base-emitter voltage of the signal-amplifying bipolar transistor 101 or 102 can be controlled by the resistance Rdc (namely, the value of the resistor 13 in the front stage, and the value of the resistor 3 in the rear stage) When the resistance Rdc is set to a small value, the variation $\Delta Vbe$ becomes a positive value, whereas when the resistance value Rdc is set to a large value, the variation $\Delta Vbe$ becomes a negative value. Therefore, whether the operation class of the front amplification stage is set to class A or class AB close to class A, while the operation class of the rear amplification stage is set to class B or class AB close to class B, or whether both the front and rear amplification stages are set to class B or class AB close to class B, the proper adjustment of the values of the resistors 13 and 3 enables the distortion characteristic of the front stage and that of the rear stage to be adjusted in such a way as to offset them each other. Consequently, the distortion characteristic of the entire power amplifier is adjusted optimally. The power efficiency can be improved to a higher extent by selecting an operation class close to class B for both the front and the rear amplification stages.

Seventh Embodiment

Figure 12:
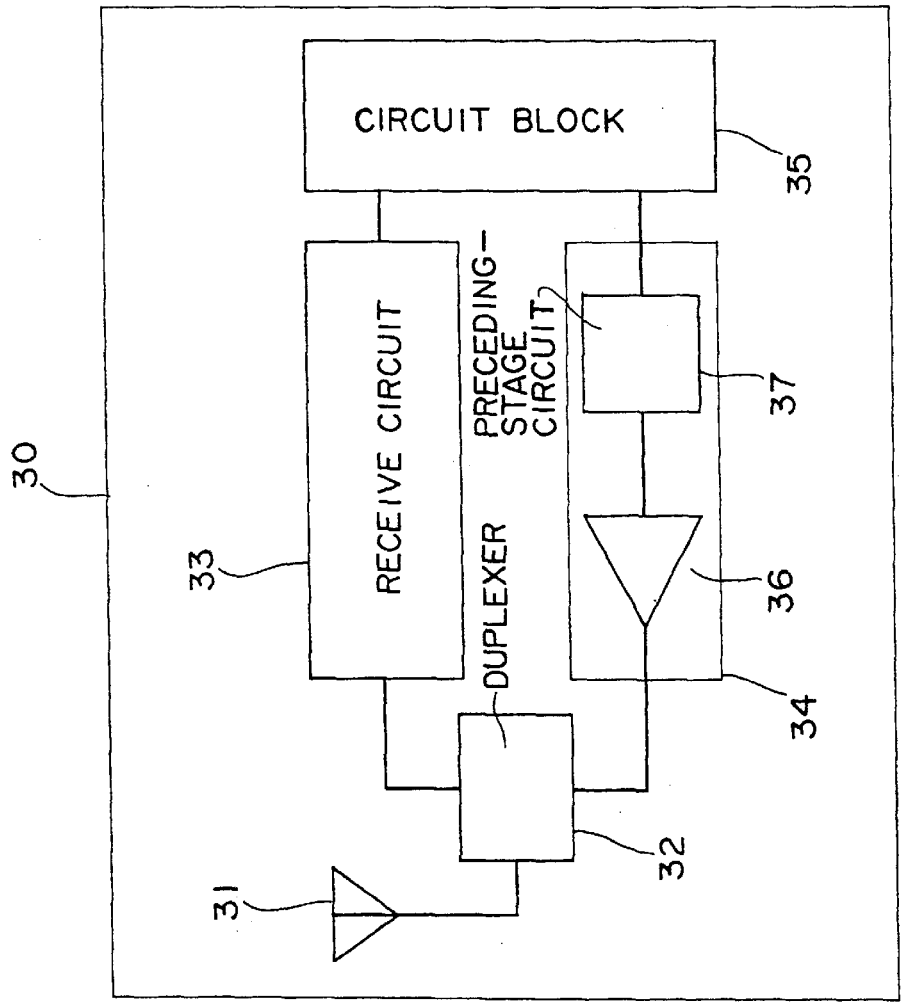
FIG. 12 is a block diagram showing the construction of a radio communication apparatus, according to a seventh embodiment of the present invention, using the power amplifier according to the present invention.

FIG. 12 is a block diagram showing the construction of a radio communication apparatus, according to a seventh embodiment of the present invention, using a power amplifier.

As shown in FIG. 12, the radio communication apparatus 30 includes an antenna 31, a duplexer 32 connected to the antenna 31, a receive circuit 33 connected to an output terminal of the duplexer 32, a send circuit 34 as a functional block connected to an input terminal of the duplexer 32, a circuit block 35 receiving a signal from the receive circuit 33 and having a modulator and a demodulator and a base band circuit. The send circuit 34 includes a preceding-stage circuit 37 receiving a signal from the circuit block 35, and a power amplifier 36 amplifying a signal sent from the preceding-stage circuit 37 and outputting the amplified signal to the duplexer 32. The send circuit 34 serving as a function block is constructed of the power amplifier 36 and the front-stage circuit 37.

Using the power amplifier according to any one of the first through the sixth embodiment as the power amplifier 36 allows the radio communication apparatus 30 to have an increased efficiency and a reduced distortion when transmitting a signal, and also helps reduce the size of the radio communication apparatus 30.

In the seventh embodiment, the power amplifier 36 has the two-stage construction. However, the power amplifier may have three or more amplification stages. In such a case also, similar effects can be obtained by using the above distortion compensation circuit at one or more places in the power amplifier.

In the first embodiment through the sixth embodiment, the power amplifier provided with the distortion compensation circuit having the variable impedance element, the adjusting circuit, and the DC current adjusting element has been described. But the present invention is applicable to the power amplifier provided with the distortion compensation circuit having the variable impedance element essentially.

In the first embodiment through the sixth embodiment, the power amplifier having two amplification stages using a bipolar transistor as the amplification element has been described. But the present invention is also applicable to a power amplifier having three or more amplification stages. Further it is possible to apply the present invention to a power amplifier using a field effect transistor as the amplification element, instead of the bipolar transistor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A power amplifier, comprising:
   a plurality of amplification stages in each of which a transistor is used as an amplification element; and
   a distortion compensation circuit for compensating a distortion in at least one of the plurality of amplification stages,
   wherein the at least one amplification stage that undergoes distortion compensation by the distortion compensation circuit and the remaining amplification stage or stages that do not undergo the distortion compensation by the distortion compensation circuit have opposite dependencies of an amplitude and/or a phase on an input power level.

2. A power amplifier, comprising:
   a plurality of amplification stages in each of which a bipolar transistor is used as an amplification element; and
   a distortion compensation circuit for compensating a distortion in at least one of the plurality of amplification stages,
   the distortion compensation circuit functioning also as a biasing circuit for the bipolar transistor in the amplification stage that undergoes distortion compensation by the distortion compensation circuit.

3. A power amplifier comprising:
   a plurality of amplification stages in each of which a bipolar transistor is used as an amplification element;
   a voltage application means for applying a voltage to a base of each of the bipolar transistors in the amplification stages; and
   a distortion compensation circuit for compensating a distortion in at least one of said amplification stages,
   the distortion compensation circuit including a variable impedance element connected between the voltage application means and the base of the bipolar transistor in the amplification stage that undergoes distortion compensation by the distortion compensation circuit.

4. The power amplifier according to claim 3, wherein said distortion compensation circuit comprises an adjusting circuit for adjusting a reactance component and/or a resistance component of an impedance characteristic when the variable impedance element is viewed from the bipolar transistor of the amplification stage that undergoes distortion compensation by the distortion compensation circuit.

5. The power amplifier according to claim 3, wherein said distortion compensation circuit comprises a DC current adjusting element for adjusting a bias current flowing through a base of the bipolar transistor of the amplification stage that undergoes distortion compensation by the distortion compensation circuit.

6. The power amplifier according to claim 5, wherein
   said adjusting circuit comprises a first resistor element having one end connected to a node between the DC current adjusting element and the variable impedance element, and a capacitor connected between the other end of the first resistor element and a ground; and
   said DC current adjusting element comprises a second resistor element whose one end is connected to said voltage application means and whose other end is connected to said variable impedance element.

7. The power amplifier according to claim 5, wherein said variable impedance element consists of a diode whose anode is connected to said DC current adjusting element and whose cathode is connected to a base of the bipolar transistor in the amplification stage that undergoes the distortion compensation.

8. The power amplifier according to claim 5, wherein said variable impedance element comprises a bipolar transistor whose emitter is connected to a base of the bipolar transistor in the amplification stage that undergoes the distortion compensation, and whose base is connected to said DC current adjusting element.

9. The power amplifier according to claim 5, wherein
   said variable impedance element comprises a variable impedance bipolar transistor whose emitter is connected to a base of the bipolar transistor in the amplification stage that undergoes the distortion compensation, and whose base is connected to said DC current adjusting element;
   said adjusting circuit comprises a first resistor element connected between a collector and a base of said variable impedance bipolar transistor and a capacitor element connected between the base of said variable impedance bipolar transistor and a ground; and
   said DC current adjusting element comprises a second resistor element whose one end is connected to said voltage application means and whose other end is connected to said variable impedance element.

10. The power amplifier according to claim 5, wherein
    said variable impedance element comprises a variable impedance bipolar transistor whose emitter is connected to a base of the bipolar transistor in the amplification stage that undergoes the distortion compensation, and whose base is connected to said DC current adjusting element;
    said adjusting circuit comprises a first resistor element having one end connected to a node between the DC current adjusting element and the variable impedance element, and a capacitor connected between the other end of the first resistor element and a ground; and
    said DC current adjusting element comprises a second resistor element whose one end is connected to said voltage application means and whose other end is connected to said variable impedance element, and a third resistor element connected between the base of the bipolar transistor in the amplification stage that undergoes the distortion compensation and a ground.

11. A radio communication apparatus using the power amplifier according to claim 1 in a functional block for supplying a signal to a transmission antenna thereof.

12. A radio communication apparatus using the power amplifier according to claim 2 in a functional block for supplying a signal to a transmission antenna thereof.

13. A radio communication apparatus using the power amplifier according to claim 3 in a functional block for supplying a signal to a transmission antenna thereof.

14. A power amplifier, comprising:
    a plurality of amplification stages in each of which a transistor is used as an amplification element, the plurality of amplification stages including a front-stage and a rear-stage; and
    a distortion compensation circuit for compensating a distortion in at least one of the front-stage or rear-stage,
    wherein the at least one amplification stage that undergoes distortion compensation by the distortion compensation circuit and the remaining amplification stage or stages that do not undergo the distortion compensation by the distortion compensation circuit have opposite dependencies of an amplitude and/or a phase on an input power level,
    wherein the front-stage is biased in a class A or class AB close to class A mode and the rear-stage is biased in a class B or class AB close to class B mode.

15. A power amplifier, comprising:

a plurality of amplification stages in each of which a bipolar transistor is used as an amplification element, the plurality of amplification stages including a front-stage and a rear-stage; and a distortion compensation circuit for compensating a distortion in at least one of the front-stage or the rear-stage, the distortion compensation circuit functioning also as a biasing circuit for the bipolar transistor in the amplification stage that undergoes distortion compensation by the distortion compensation circuit, wherein the front-stage is biased in a class A or class AB close to class A mode and the rear-stage is biased in a class B or class AB close to class B mode.

16. A power amplifier, comprising:

a plurality of amplification stages in each of which a bipolar transistor is used as an amplification element, the plurality of amplification stages including a front-stage and a rear-stage;

a voltage application means for applying a voltage to a base of each of the bipolar transistors in the amplification stages; and a distortion compensation circuit for compensating a distortion in at least one of the front-stage or the rear-stage, the distortion compensation circuit including a variable impedance element connected between the voltage application means and the base of the bipolar transistor in the amplification stage that undergoes distortion compensation by the distortion compensation circuit, wherein the front-stage is biased in a class A or class AD close to class A mode and the rear-stage is biased in a class B or class AD close to class B mode.

* * * * *